United States Patent
Schwarz et al.

(10) Patent No.: US 10,074,769 B2
(45) Date of Patent: Sep. 11, 2018

(54) METHOD OF PRODUCING OPTOELECTRONIC COMPONENTS HAVING COMPLEX SHAPES

(71) Applicant: OSRAM Opto Semiconductors GmbH, Regensburg (DE)

(72) Inventors: Thomas Schwarz, Regensburg (DE); Hans-Jürgen Lugauer, Sinzing (DE); Jürgen Moosburger, Regensburg (DE); Stefan Illek, Donaustauf (DE); Tansen Varghese, Regensburg (DE); Matthias Sabathil, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/767,634

(22) PCT Filed: Feb. 6, 2014

(86) PCT No.: PCT/EP2014/052336
§ 371 (c)(1),
(2) Date: Aug. 13, 2015

(87) PCT Pub. No.: WO2014/128003
PCT Pub. Date: Aug. 28, 2014

(65) Prior Publication Data
US 2015/0380602 A1     Dec. 31, 2015

(30) Foreign Application Priority Data

Feb. 22, 2013   (DE) .................. 10 2013 202 902

(51) Int. Cl.
*H01L 33/62*     (2010.01)
*H01L 33/00*     (2010.01)
(Continued)

(52) U.S. Cl.
CPC ........ *H01L 33/0095* (2013.01); *H01L 33/483* (2013.01); *H01L 33/486* (2013.01);
(Continued)

(58) Field of Classification Search
CPC ............... H01L 33/0095; H01L 21/568; H01L 2933/005; H01L 2924/181–2924/186
See application file for complete search history.

(56) References Cited

U.S. PATENT DOCUMENTS 4,501,637 A     2/1985 Mitchell et al.
2002/0163006 A1* 11/2002 Yoganandan ......... H01L 33/486
257/81
(Continued)

FOREIGN PATENT DOCUMENTS

DE     10 2009 036 621 A1     2/2011
JP          2003332542 A  *  11/2003

OTHER PUBLICATIONS

Hatori, Yukinori, English translation of JP 2003-332542 A, Provided by AIPN. Nov. 21, 2003.*
(Continued)

*Primary Examiner* — Stephen Bradley
(74) *Attorney, Agent, or Firm* — DLA Piper LLP (US)

(57) ABSTRACT

A method of producing an optoelectronic component includes providing a carrier having a carrier surface, a first lateral section of the carrier surface being raised relative to a second lateral section of the carrier surface; arranging an optoelectronic semiconductor chip having a first surface and a second surface on the carrier surface, wherein the first surface faces toward the carrier surface; and forming a molded body having an upper side facing toward the carrier surface and a lower side opposite the upper side, the semiconductor chip being at least partially embedded in the molded body.

13 Claims, 11 Drawing Sheets

(51) Int. Cl.
  *H01L 33/48* (2010.01)
  *H01L 33/60* (2010.01)
(52) U.S. Cl.
  CPC .............. *H01L 33/60* (2013.01); *H01L 33/62* (2013.01); *H01L 2924/0002* (2013.01); *H01L 2933/0033* (2013.01)

(56) References Cited

U.S. PATENT DOCUMENTS

| | | | | |
|---|---|---|---|---|
| 2009/0086449 | A1* | 4/2009 | Minamio | H01L 27/14618 361/760 |
| 2009/0212316 | A1* | 8/2009 | Braune | H01L 24/97 257/99 |
| 2010/0038670 | A1 | 2/2010 | Panaccione et al. | |
| 2010/0311193 | A1 | 12/2010 | Lin | |
| 2011/0037094 | A1* | 2/2011 | Lin | H05K 1/021 257/99 |
| 2012/0261699 | A1* | 10/2012 | Ooyabu | H01L 33/505 257/98 |
| 2012/0326170 | A1* | 12/2012 | Liu | H01L 25/167 257/82 |
| 2013/0175686 | A1* | 7/2013 | Meyer | H01L 25/0655 257/738 |
| 2014/0097536 | A1* | 4/2014 | Schunk | H01L 31/02325 257/738 |
| 2014/0353836 | A1* | 12/2014 | O'Sullivan | H01L 21/56 257/773 |

OTHER PUBLICATIONS

First Office Action dated Feb. 20, 2017, of corresponding Chinese Application No. 201480022832.1 in English.
Fourth Office Action dated Apr. 18, 2018, of corresponding Chinese Application No. 201480022832.1 in English.

* cited by examiner

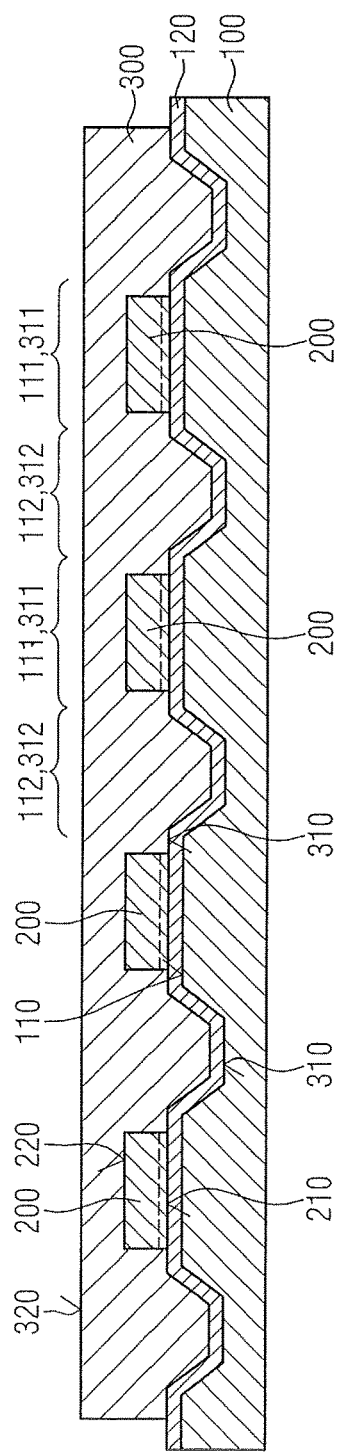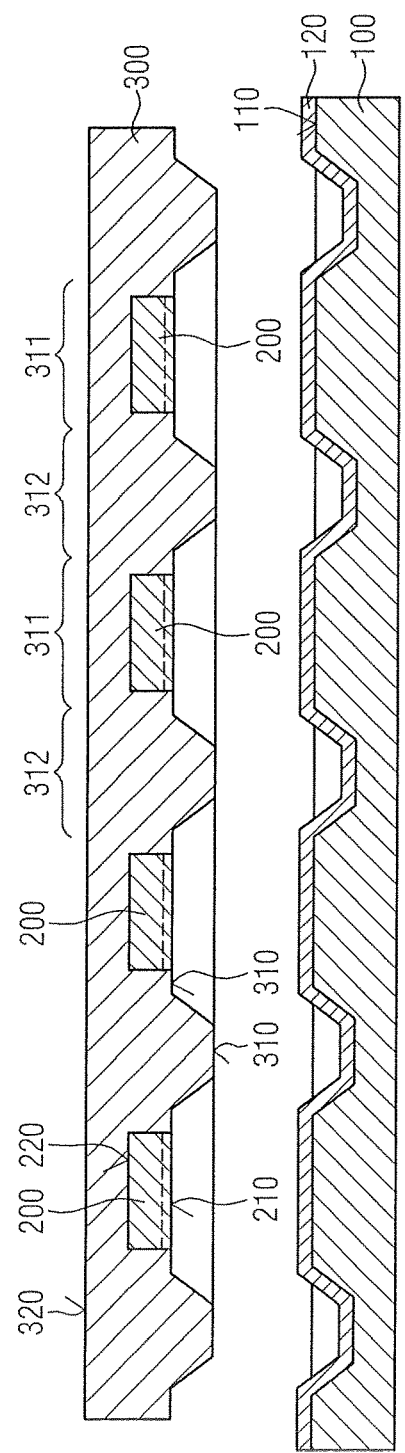

METHOD OF PRODUCING OPTOELECTRONIC COMPONENTS HAVING COMPLEX SHAPES

TECHNICAL FIELD

This disclosure relates to a method of producing an optoelectronic component and to optoelectronic components.

This patent application claims priority of DE 10 2013 202 902.0, the disclosure content of which is hereby incorporated by reference.

BACKGROUND

It is known to equip electronic components with packages which fulfill a plurality of different functions. Known packages may, for example, provide an electrical connection to a semiconductor chip which the electronic component comprises, and an interface to a circuit carrier. Known packages may also be used for thermal management and as protection against damage by electrostatic discharges. In optoelectronic components such as light-emitting diodes, sensors or photovoltaic concentrators, packages may also fulfill further functions such as input and output of light, influencing a spatial light distribution or conversion of a light wavelength.

DE 10 2009 036 621 A1 discloses a method of producing an optoelectronic semiconductor component in which optoelectronic semiconductor chips are arranged on an upper side of a carrier. The optoelectronic semiconductor chips are molded around with a molded body, which covers all the side surfaces of the optoelectronic semiconductor chips. Upper and lower sides of optoelectronic semiconductor chips preferably remain free. After removal of the carrier, the optoelectronic semiconductor chips may be divided up. Contact locations may be provided on the upper and/or lower sides of each semiconductor chip. The molded body may, for example, consist of a molding material based on epoxide.

It could nonetheless be helpful to provide a method of producing an optoelectronic component and an optoelectronic component.

SUMMARY

We provide a method of producing an optoelectronic component including providing a carrier having a carrier surface, a first lateral section of the carrier surface being raised relative to a second lateral section of the carrier surface; arranging an optoelectronic semiconductor chip having a first surface and a second surface on the carrier surface, wherein the first surface faces toward the carrier surface; and forming a molded body having an upper side facing toward the carrier surface and a lower side opposite the upper side, the semiconductor chip being at least partially embedded in the molded body.

We also provide an optoelectronic component including an optoelectronic semiconductor chip having a first surface, wherein the semiconductor chip is embedded in a molded body having an upper side; the first surface of the semiconductor chip is flush with a first section of the upper side of the molded body; and the upper side of the molded body has a second section raised relative to the first section.

We further provide an optoelectronic component including an optoelectronic semiconductor chip, wherein the semiconductor chip is embedded in a molded body having an upper side and a lower side opposite the upper side, the molded body having a through-opening extending between the upper side and the lower side.

BRIEF DESCRIPTION OF THE DRAWINGS

FIG. 5 shows a sectional view of the carrier with a molded body formed thereon.

FIG. 6 shows the molded body after separation from the carrier.

Figure 1:
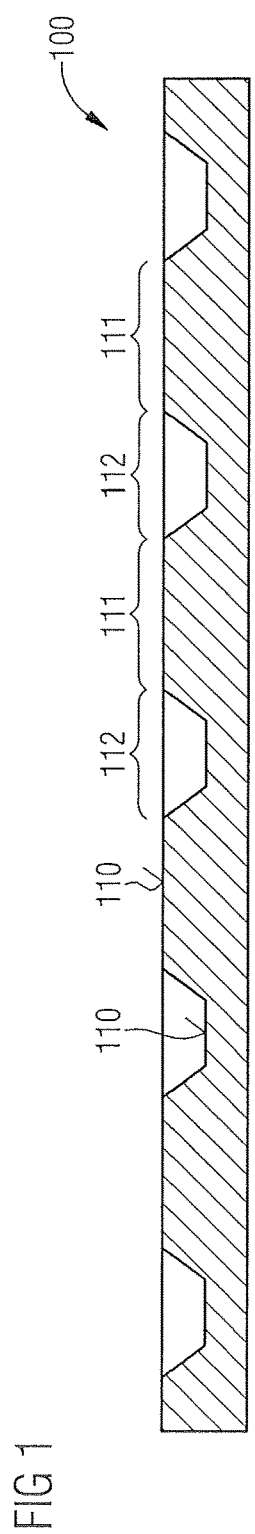
FIG. 1 shows a sectional view of a carrier.

LIST OF REFERENCES 10 optoelectronic component
20 optoelectronic component
30 optoelectronic component
40 optoelectronic component
50 optoelectronic component
100 carrier
110 carrier surface
111 first lateral section (raised)
112 second lateral section (depressed)
120 adhesion layer
125 structured adhesion layer
200 optoelectronic semiconductor chip
210 first surface
220 second surface
250 electrically conductive pin
260 bonding wire
300 molded body
301 separating region 310 upper side
311 first lateral section (raised)
312 second lateral section (depressed)
320 lower side
325 ground lower side
330 metallization
340 cavity
341 wall
342 rounded wall
350 optical lens
1300 molded body
1301 separating region
1310 upper side
1311 first lateral section (raised)
1312 second lateral section (depressed)
1340 cavity
2100 carrier
2110 carrier surface
2111 first lateral section (raised)
2112 second lateral section (depressed)
2113 third lateral section (raised higher)
2120 posts
2300 molded body
2310 upper side
2311 first lateral section (depressed)
2312 second lateral section (raised)
2313 third lateral section (depressed lower)
2330 metallization
2331 first contact surface
2332 second contact surface
2333 through-contact
2350 opening
2351 wall

DETAILED DESCRIPTION

In a method of producing an optoelectronic component, steps are carried out to provide a carrier having a carrier surface, a first lateral section of the carrier surface being raised relative to a second lateral section of the carrier surface, and an optoelectronic semiconductor chip having a first surface and a second surface on the carrier surface, the first surface facing toward the carrier surface, and to form a molded body having an upper side facing toward the carrier surface and a lower side opposite the upper side, the semiconductor chip being at least partially embedded in the molded body.

The height difference between the first lateral section of the carrier surface and the second lateral section of the carrier surface may, for example, lie between a few micrometers and a few millimeters.

Advantageously, this method makes it possible to produce the molded body with a geometry more complex than a flat disk. The arrangement of the optoelectronic semiconductor on the carrier surface having the first lateral section and the second lateral section advantageously has the effect of precise orientation of the semiconductor embedded in the molded body with respect to the structures protruding from the carrier surface onto the molded body. In this way, for example, the molded body can be provided with openings to apply the electrically conductive through-contacts or with integrated reflectors, integrated holders for optical elements or integrated cavities to receive light-converting material. Furthermore, it is possible to provide the molded body with structures for mechanical reinforcement of the molded body so that the method can be carried out more easily and with less risk of damage.

An adhesion layer may be arranged on at least a part of the carrier surface. The semiconductor chip is then arranged on the adhesion layer. Advantageously, the semiconductor chip can be arranged on the adhesion layer simply and economically with the aid of a pick&place method which can be automated for mass production. The adhesion layer advantageously prevents inadvertent slipping of the semiconductor chip during the further processing.

A further step of separating the molded body from the carrier may be carried out. Advantageously, the carrier may subsequently be reused so that the method can be economically carried out. Separation of the molded body may, for example, be carried out by reducing adhesion of the adhesion layer by a thermal method, exposure to, e.g., UV light, a wet chemical treatment or a laser treatment. Separation of the molded body may also be carried out by exerting shear or tensile forces.

A part of the molded body may be removed after formation of the molded body. In this way, a surface of the semiconductor chip can be advantageously exposed.

A section of the upper side of the molded body may be formed flush with the first surface of the semiconductor chip. Advantageously, the first surface of the semiconductor chip may then be electrically contacted on the upper side of the molded body. Furthermore, electromagnetic radiation, for example, visible light, may be emitted from the semiconductor chip through the first surface of the semiconductor chip.

The lower side of the molded body may be formed flush with the second surface of the semiconductor chip. Advantageously, the second surface of the semiconductor chip is then accessible on the lower side of the molded body, which allows electrical contacting of the semiconductor chip.

A metallization may be arranged on the lower side of the molded body. Advantageously, the metallization may then be used to electrically contact the semiconductor chip. The metallization may furthermore be used to dissipate waste heat generated in the optoelectronic component.

An electrically conductive element may be arranged on the carrier surface. The electrically conductive element is then at least partially embedded in the molded body. Advantageously, the electrically conductive element in the optoelectronic component produced in this way may provide an electrically conductive connection between the upper side and the lower side of the molded body.

An electrically conductive connection may be established between the semiconductor chip and the electrically conductive element. Advantageously, the electrically conductive element then establishes electrical contact with the semiconductor chip.

A bond connection may be established between the semiconductor chip and the electrically conductive element. Advantageously, the bond connection may be economically established in an automated fashion and has a high reliability.

The semiconductor chip may be arranged in the first lateral section of the carrier surface. Advantageously, the semiconductor chip is thereby embedded into a depressed region of the molded body so that the first surface of the semiconductor chip is enclosed by raised sections of the molded body, which can provide mechanical functionalities.

The second lateral section of the carrier surface may annularly enclose the first lateral section. Advantageously, a raised lateral section of the upper side of the molded body is thereby produced, which annually encloses a depressed lateral section of the upper side of the body. The cavity thereby formed above the depressed lateral section of the upper side of the molded body can advantageously provide various mechanical functions.

A raised lateral section and a depressed lateral section may be formed on the upper side of the molded body. In this case, in a further step an optical lens is arranged over the lateral section of the molded body. Advantageously, the arrangement of the lens above the depressed lateral section of the molded body can be carried out simply in an automated fashion, the lens being oriented precisely in a self-aligned fashion by the depressed lateral section.

The molded body may be formed from an optically white material. Advantageously, a raised lateral section on the upper side of the molded body can then be used as an optical reflector and lead to beam shaping of the light emitted by the optoelectronic component.

The upper side of the molded body may be coated at least in sections with an optically reflective material. Advantageously, a raised lateral section on the upper side of the molded body can also be used as an optical reflector in this example and lead to beam shaping of the light emitted by the optoelectronic component.

The molded body may be formed with a through-opening extending between the upper side and the lower side. In this case, a conductive coating is arranged on a wall of the through-opening. Advantageously, a through-opening is thereby applied which provides an electrically conductive connection between the upper side and the lower side of the molded body.

A multiplicity of semiconductor chips may be arranged on the carrier surface. In this case, the molded body is divided up in a further step. Advantageously, the method thereby allows parallel production of a multiplicity of optoelectronic components so that the production costs the individual optoelectronic component are drastically reduced.

An optoelectronic component has an optoelectronic semiconductor chip having a first surface. The semiconductor chip is embedded in a molded body having an upper side. In this case, the first surface of the semiconductor chip is flush with a first section of the upper side of the molded body. The upper side of the molded body furthermore has a second section raised relative to the first section. The upper side of the molded body furthermore has a second section raised relative to the first section. Advantageously, the raised second section of the upper side of the molded body of this optoelectronic component can provide mechanical functionalities. For example, the upper side of the molded body may comprise an integrated optical reflector, be used to hold an optical lens, form a cavity to receive a light-converting material, or contribute to mechanical stabilization of the molded body.

The height difference between the second section of the upper side of the molded body and the first section of the upper side of the molded body may, for example, lie between a few micrometers and a few millimeters.

A further optoelectronic component has an optoelectronic semiconductor chip embedded in a molded body having an upper side and a lower side opposite the upper side. In this case, the molded body has a through-opening extending between the upper side and the lower side. For example, the through-opening of the molded body of this optoelectronic component may provide an electrically conductive connection between the upper side and the lower side of the molded body.

The molded body may be formed in one piece. In this way, the molded body can advantageously be produced simply and economically.

The above-described properties, features and advantages, as well as the way in which they are achieved, will become more clearly and comprehensively understandable in conjunction with the following description of the examples, which will be explained in more detail in connection with the drawings.

FIG. 1 shows a carrier 100 in a schematized sectional representation. The carrier 100 may, for example, be configured in the form of a wafer as a thin disk. The carrier 100 may, for example, consist of silicon. The carrier 100 may, however, also consist of a metal or another material.

The carrier 100 has a carrier surface 110. The carrier surface 110 is laterally structured and has a first lateral section 111 and a second lateral section 112. The first lateral sections 111 are raised in the direction perpendicular to the carrier surface 110 relative to the second lateral section 112. The height difference between the raised first lateral sections 111 and the depressed second lateral sections 112 of the carrier surface 110 may, in the direction perpendicular to the carrier surface 110, lie, for example, between a few micrometers and a few millimeters.

The structured carrier surface 110 of the carrier 100 has island-like elevations in the first lateral sections 111, each of which is enclosed by depressed second lateral sections 112. In the plane of the carrier surface 110, the island-like first lateral sections 111 may, for example, be formed in the shape of circular disks. The individual first lateral sections 111 may, for example, be arranged at the node points of a hexagonal lattice in the lateral direction of the carrier surface 110. The carrier surface 110 of the carrier 100 could, however, be subdivided in another way into raised first lateral sections 111 and depressed second lateral sections 112.

Figure 2:
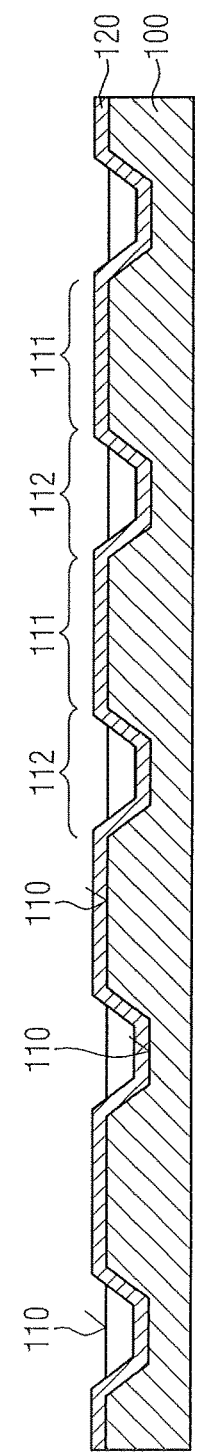
FIG. 2 shows a view of the carrier with an adhesion layer arranged thereon.

FIG. 2 shows the carrier 100 in a schematic sectional representation in a method stage subsequent to the representation of FIG. 1. An adhesion layer 120 has been applied on the carrier surface 110 of the carrier 100. The adhesion layer 120 extends both over the first lateral sections 111 of the carrier surface 110 and over the second lateral sections 112 of the carrier surface 110.

The adhesion layer 120 may, for example, be formed as a film with a thermally separable adhesion layer on one side and a conventional adhesive layer on the other side. The thermally separable adhesion layer then preferably faces toward the carrier surface 110 of the carrier 100. The adhesion layer 120 may also be in the form of an adhesive which can be separated thermally, which can be separated by exposure to light, for example, UV light, which can be separated by wet chemical treatment or which can be separated by a laser treatment. The adhesive of the adhesion layer 120 may also be separable by exerting a shear or tensile force.

The adhesion layer 120 may have been laminated onto the carrier surface 110 of the carrier 100 by rolling or by a vacuum or a gas pressure. The adhesion layer 120 may also have been sprayed or applied by spin coating onto the carrier surface 110 of the carrier 100. The adhesion layer 120 may have been arranged on the carrier surface 110 by chemical or physical vapor deposition. The application of the adhesion layer 120 by printing, stamping, dispensing, jetting or another method is also possible.

Figure 3:
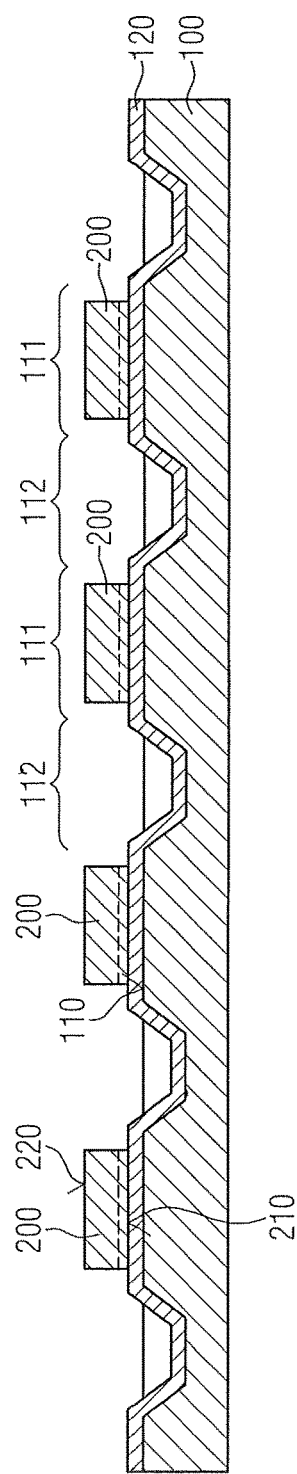
FIG. 3 shows a view of the carrier with optoelectronic semiconductor chips arranged on the adhesion layer.

FIG. 3 shows the carrier 100 with the adhesion layer 120 arranged on the carrier surface 110 in a further later method stage. Optoelectronic semiconductor chips 200 have been arranged on the first lateral sections 111 of the carrier surface 110. In the example represented, an optoelectronic semiconductor chip 200 is arranged in each first lateral section 111 of the carrier surface 110.

The optoelectronic semiconductor chips 200 each have a first surface 210 and a second surface 220 opposite the first surface 210. The first surface 210 of each optoelectronic semiconductor chip 200 faces toward the carrier surface 110 of the carrier 100 and is therefore in contact with the adhesion layer 120.

The optoelectronic semiconductor chips 200 may, for example, be the light-emitting diode chips, laser chips or photovoltaic chips. If the optoelectronic semiconductor chips 200 are light-emitting diode chips (LED chips), then the first surface 210 of each optoelectronic semiconductor chip 200 may be a light-emitting surface.

The optoelectronic semiconductor chips 200 may, for example, have been arranged on the carrier surface 110 of the carrier 100 in an automated fashion by a pick&place method. In this case, the contours of the first lateral sections 111 of the carrier surface 100 may have been detected by image recognition to arrange the optoelectronic semiconductor chips 200, for example, centrally in the first lateral sections 111. Instead of a central arrangement, the optoelectronic semiconductor chips 200 may however also have been placed on the carrier surface 110 at any other desired position in the first lateral sections 111.

Figure 4:
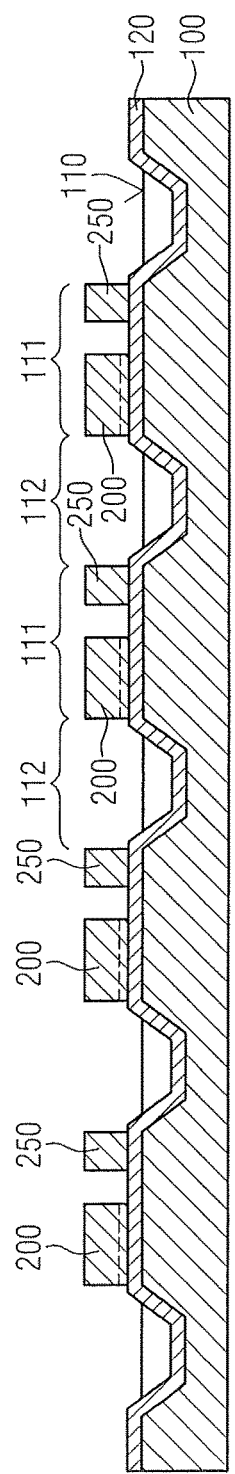
FIG. 4 shows another view of the carrier with optoelectronic semiconductor chips arranged thereon from a different viewing direction.

FIG. 4 shows another sectional representation of the carrier 100 with the optoelectronic semiconductor chips 200 arranged on the carrier surface 110. In the representation of FIG. 4, the section plane extends perpendicularly to the section plane of the representation of FIG. 3.

In the first lateral sections 111 of the carrier surface 110, electrically conductive pins 250 are arranged next to the optoelectronic semiconductor chips 200 on the carrier surface 110. In each lateral section 111, an electrically conductive pin 250 is arranged next to an optoelectronic semiconductor chip 200. However, two electrically conductive pins 250 could also be arranged next to an optoelectronic semiconductor 200 in each first lateral section 111.

The electrically conductive pins 250 consist of an electrically conductive material. The electrically conductive pins 250 may, for example, consist of a metal or a doped semiconductor material. The optoelectronic semiconductor chips 200 and the electrically conductive pins 250 are separated from one another and are therefore electrically insulated from one another.

The electrically conductive pins 250 have, in the direction perpendicular to the carrier surface 110, for instance the same thickness as the optoelectronic semiconductor chips 200. The rest of the geometry of the electrically conductive pins 250 may be selected in any desired way. The electrically conductive pins 250 may also generally be referred to as electrically conductive elements.

FIG. 5 shows another sectional representation of the carrier 100 in a subsequent method stage. The section in this case extends along the same plane as in the representation of FIG. 3.

A molded body 300 has been formed on the carrier surface 110 of the carrier 100. The molded body 300 has preferably been formed by an injection molding process, and injection compression molding process or another molding process. Production of the molded body 300 may preferably be carried out in a laminating device or a device for compression, transfer or injection molding. The molded body 300 consists of an electrically insulating molding material. For example, the molded body 300 may consist of an epoxide-based material.

The molded body 300 has an upper side 310 and a lower side 320 opposite the upper side 310. The surface 310 of the molded body 300 faces toward the carrier surface 310 of the carrier 100, and is therefore in contact with the adhesion layer 120. The structure of the structured carrier surface 110 has been transferred as a negative onto the upper side 310 of the molded body 300. In this way, the upper side 310 of the molded body 300 is also structured in the lateral direction and has first lateral sections 311 and second lateral sections 312. The second lateral sections 312 of the upper side 310 are raised relative to the first lateral sections 311. The first lateral sections 311 of the upper side 310 of the molded body 300 have been formed above the first lateral sections 111 of the carrier surface 110 of the carrier 100. The second lateral sections 312 of the upper side 310 of the molded body 300 have been formed below the second lateral sections 112 of the carrier surface 310 of the carrier 100.

The optoelectronic semiconductor chips 200 and the electrically conductive pins 250, which cannot be seen in FIG. 5, are at least partially embedded into the molded body 300. The first surface 210 of each optoelectronic semiconductor chip 200 is in this case flush with the upper side 310 in a first lateral section 311 of the molded body 300 and is therefore accessible on the upper side 310 of the molded body 300. Correspondingly, the electrically conductive pins 250 in the first lateral sections 311 of the upper side 310 of the molded body 300 are also accessible.

In a subsequent processing step, the molded body 300 may have been separated from the carrier surface 110 of the carrier 100, as schematically represented in FIG. 6. To this end, the molded body 300 and the carrier surface 110 of the carrier 100 are separated from the adhesion layer 120. Preferably, the adhesion layer 120 is initially separated from the carrier surface 110 of the carrier 100 and remains on the molded body 300. The adhesion layer 120 is subsequently separated from the molded body 300. Separation of the carrier surface 110 of the carrier 100 from the adhesion layer 120 may, for example, be carried out by heating the adhesion layer 120, exposing the adhesion layer 120 to UV light, exposing the adhesion layer 120 to a laser beam, treating the adhesion layer 120 with a wet chemical method or exerting a shear force or a tensile force. The upper side 310 of the molded body 300 may subsequently be cleaned to remove residues of the adhesion layer 120 remaining on the upper side 310 of the molded body 300. Such a cleaning step may, however, also be unnecessary and then omitted.

Figure 7:
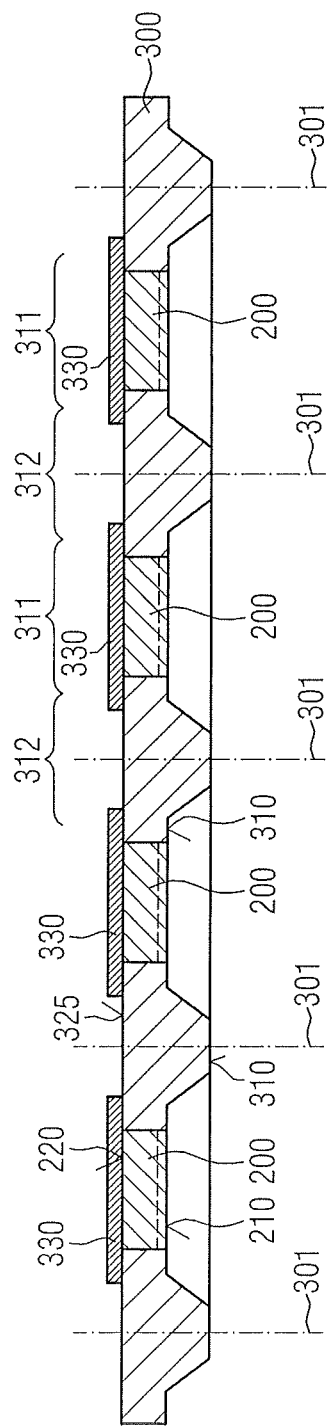
FIG. 7 shows a sectional view of the molded body after further processing.

FIG. 7 shows the molded body 300 after further processing steps have been carried out. First, the lower side 320 of the molded body 300 was partially removed by grinding such that the second surface 220 of the optoelectronic semiconductor chip 200 became accessible on the resulting ground lower side 325. The second surfaces 220 of the optoelectronic semiconductor chips 200 are flush with the ground lower side 325 of the molded body 300. Correspondingly, the electrically conductive pins 250 are also accessible on the ground lower side 325 of the molded body 300 and are flush with the ground lower side 325 of the molded body 300. The electrically conductive pins 250 thereby respectively provide an electrically conductive connection between the upper side 310 of the molded body 300 and the ground lower side 325 of the molded body 300.

After grinding the molded body 300, a metallization 330 was arranged on the ground lower side 325 of the molded body 300 and structured by lithographic methods. An electrically conductive section of the metallization 330 is respectively in electrically conductive contact with an electrical contact surface on the second surface 220 of each optoelectronic chip 200.

After further processing steps, explained in more detail below, the molded body 300 is divided along separating regions 301 which are indicated in FIG. 7. Division of the molded body 300 may, for example, be carried out by sawing. The separating regions 301 extend perpendicularly to the upper side 310 of the molded body 300 through the second lateral sections 312 of the upper side 310 of the molded body 300 such that each first lateral section 311 is separated from all other first lateral sections 311 of the upper side 310 of the molded body 300.

Figure 8:
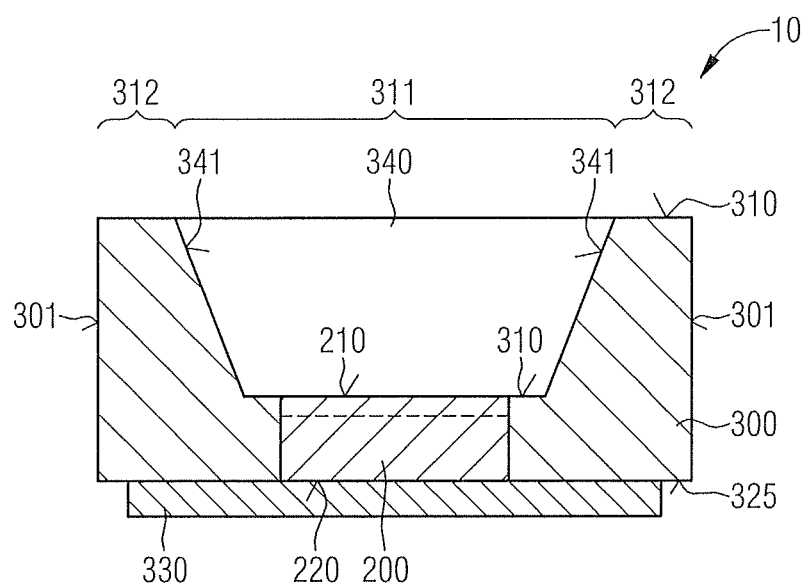
FIG. 8 shows a sectional view of an optoelectronic component formed from the molded body according to a first example.

FIG. 8 shows a schematic sectional representation of an optoelectronic component 10 resulting from division of the molded body 300 according to a first example. It was possible to obtain a multiplicity of such optoelectronic components 10 by division of the molded body 300.

The depressed first lateral section 311 of the upper side 310 of the molded body 300 forms a cavity 340 laterally bounded by parts of raised second lateral sections 312 of the upper side 310 of the molded body 300. These boundaries form a wall 341 of the cavity 340. In the example represented, the wall 341 is formed as a chamfer so that the cavity 340 has the shape of a conic frustum. At the bottom, formed by the depressed first lateral section 311, of the cavity 340, the first surface 210 of the optoelectronic semiconductor chip 200 is accessible. In the example of the optoelectronic component 10, the optoelectronic semiconductor chip 200 is preferably an LED chip that emits electromagnetic radiation, for example, visible light through the first surface 210.

The cavity 340 of the optoelectronic component 10 may be filled with a material that leads to conversion of a wavelength of the electromagnetic radiation emitted by the optoelectronic semiconductor chip 200. This material is preferably already introduced into the cavity 340 in the method stage shown in FIG. 7, before the optoelectronic component 10 is separated from the other optoelectronic components 10 by dividing up the molded body 300. This makes it possible to fill the cavities 340 of all the optoelectronic components 10 simultaneously in a common working step.

A material arranged in the cavity 340 may, for example, comprise an optically transparent silicone filled with wavelength-converting particles. The particles contained in the material may also be sedimented in the cavity 340 in the direction of the first surface 210 of the optoelectronic semiconductor chip 200. This is favorable in particular when the optoelectronic component 10 is configured for a high power.

If no wavelength conversion is desired, then the cavity 340 may merely be filled with an optically transparent material, for example, with silicone to protect the optoelectronic semiconductor chip and a bonding wire optionally connected to the optoelectronic semiconductor chip 200 (see below). Instead of being filled with wavelength-converting particles, the material arranged in the cavity 340 may also be filled with merely light-scattering particles. These may be used for light mixing.

Figure 9:
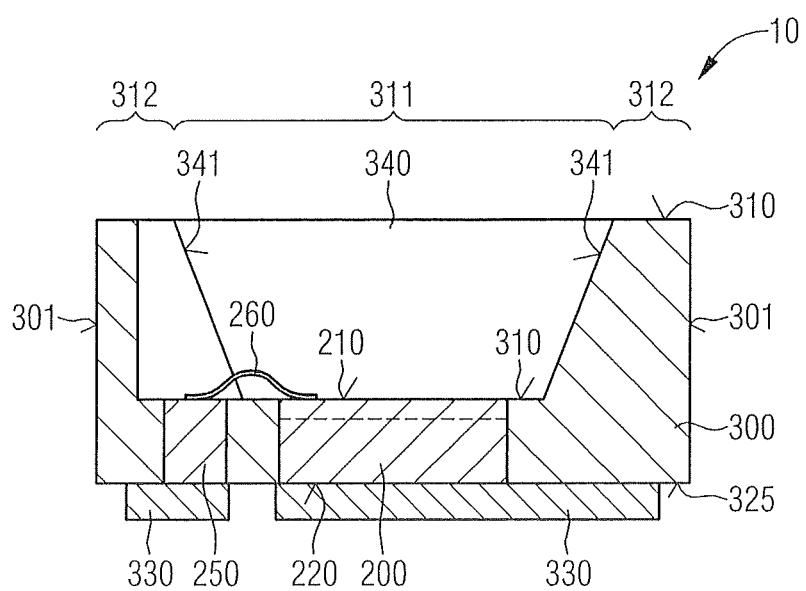
FIG. 9 shows a sectional representation in another section plane of the optoelectronic component of the first example.
Figure 10:
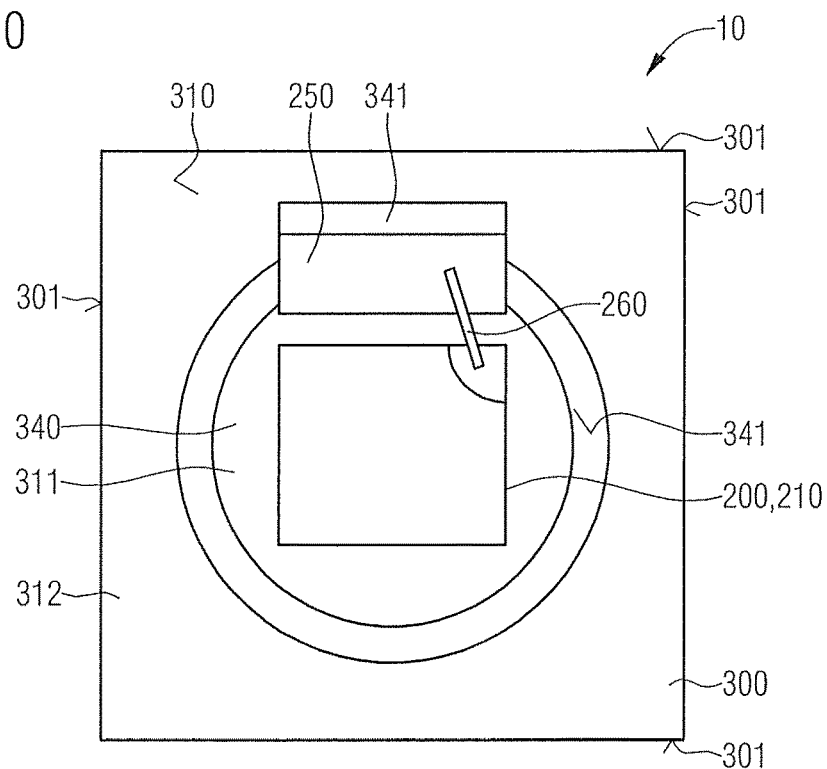
FIG. 10 shows a plan view of the optoelectronic component of the first example.

FIG. 9 shows a section, perpendicular to the representation of FIG. 8, through the optoelectronic component 10 according to the first example. FIG. 10 shows a plan view of the optoelectronic component 10 of the first example. Respectively visible are the optoelectronic semiconductor chip 200 and the electrically conductive pin 250, both of which extend in the depressed first lateral section 311 of the molded body 300 between the upper side 310 and the ground lower side 325 of the molded body 300. An electrical contact arranged on the first surface 210 of the optoelectronic semiconductor chip 200 is electrically conductively connected by a bonding wire 260 to the electrically conductive pin 250. The bonding wire 260 was preferably already applied before the optoelectronic component 10 or separated from the other optoelectronic components 10 by dividing up the molded body 300. The bonding wire 260 located in the cavity 340 is mechanically protected by a material optionally arranged in the cavity 340. Instead of the bonding wire 260, there could also be another type of electrical contacting between the first surface 210 of the optoelectronic semiconductor chip 200 and the electrically conductive pin 250.

The metallization 330 arranged on the ground lower side 325 of the molded body 300 of the optoelectronic component 10 is subdivided into two sections electrically insulated from one another, one of which is electrically conductively connected to the electrically conductive pin 250 and the other of which is electrically conductively connected to an electrical contact arranged on the second surface 220 of the optoelectronic semiconductor chip. The two sections of the metallization 300 may be used to electrically contact the optoelectronic component 10. For example, the optoelectronic component 10 may be contacted by reflow soldering according to a surface mount method (SMT method).

Figure 11:
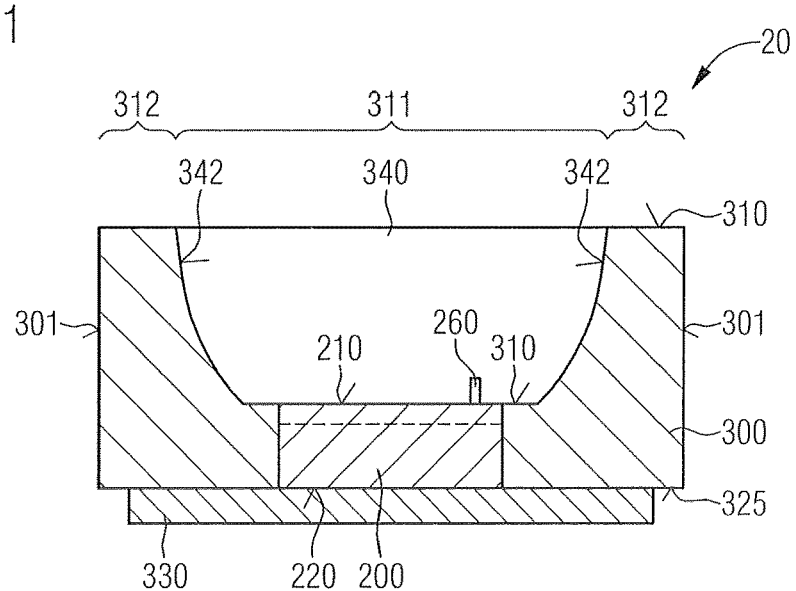
FIG. 11 shows a sectional view of an optoelectronic component according to a second example.

FIG. 11 shows a section through an optoelectronic component 20 according to a second example. The optoelectronic component 20 has correspondences with the optoelectronic component 10 of the first example and can be produced by the same method.

In contrast to the optoelectronic component 10, the cavity 340 of the optoelectronic component 20 has a rounded wall 342 instead of the planar wall 341. In this way, the cavity 340 of the optoelectronic component 20 has a bowl-shaped rather than frustoconical cross-sectional shape.

The rounded wall 342 of the cavity 340 of the optoelectronic component 20 has a high optical reflectivity. To this end, the molded body 300 of the optoelectronic component 20 may be formed from an optically white material. As an alternative or in addition, the rounded wall 342 of the cavity 340 may also be coated with an optically reflective material. For example, the rounded wall 342 of the cavity 340 may be coated with a metal, for example, silver. The metal may, for example, be applied by an electrolytic process.

The optically reflective rounded wall 342 of the cavity 340 is used as a reflector for electromagnetic radiation emitted through the first surface 210 of the optoelectronic semiconductor chip 200. In this way, shaping, for example, collimation of the radiation emitted by the optoelectronic semiconductor chip 200 can be achieved.

The optoelectronic semiconductor chip 200 and the optical reflector formed by the rounded wall 342 of the cavity 340 can be oriented with high accuracy relative to one another. Accuracy of the orientation is essentially determined by the accuracy of the placement, represented in FIG. 3, of the optoelectronic semiconductor chip 200 on the carrier 100 which is carried out with very high precision.

The cavity 340 of the optoelectronic component 20 may optionally in addition be filled like the cavity 340 of the optoelectronic component 10 of FIGS. 8 to 10.

Figure 12:
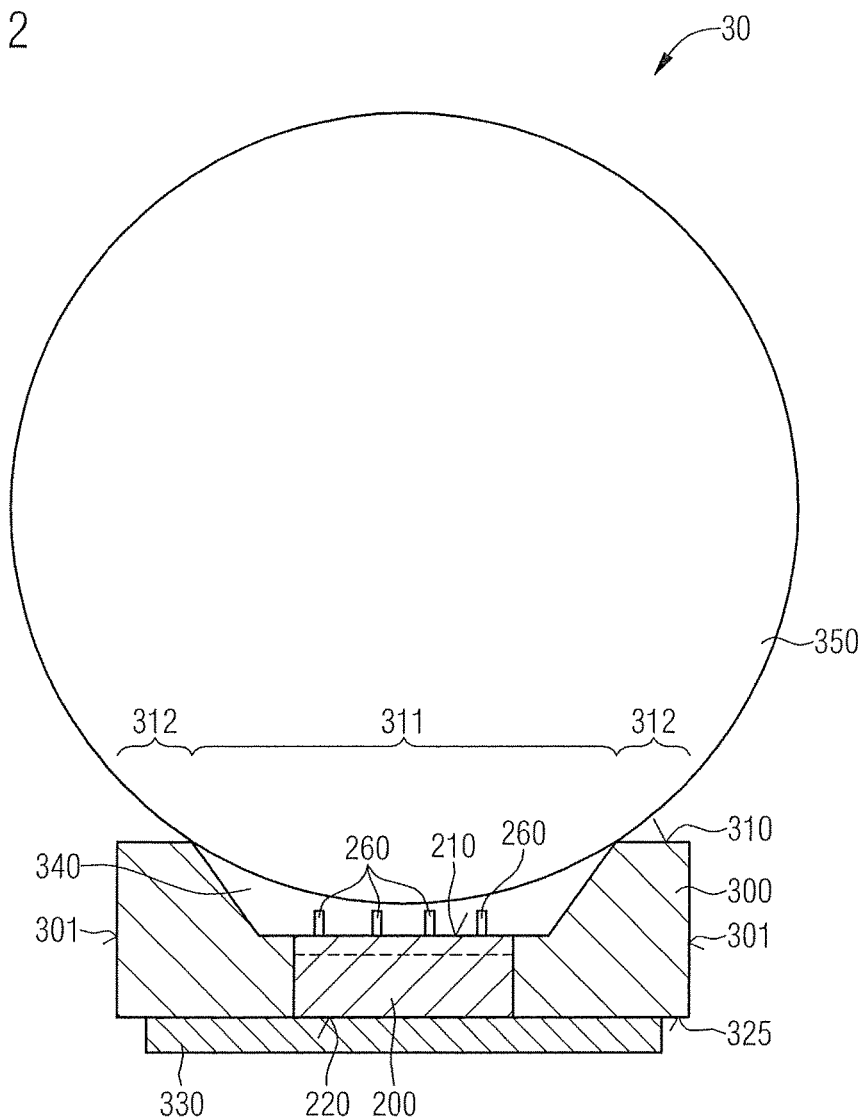
FIG. 12 shows a sectional view of an optoelectronic component according to a third example.

FIG. 12 shows a sectional representation of an optoelectronic component 30 according to a third example. The optoelectronic component 30 may be produced by the same method as the optoelectronic components 10 and 20 of the examples described above.

The optoelectronic component 30 has an optical lens 350 arranged above the upper side 310 of the molded body 300.

The optical lens 350 is arranged over the depressed first lateral section 311 of the upper side 310 of the molded body 300 such that the optical lens 350 is oriented, or aligned, by the depression. In this way, very accurate orientation is also achieved between the optoelectronic semiconductor chip 200 and the optical lens 350. Preferably, the optical lens 350 was already arranged on the molded body 300 of the optoelectronic component 30 before the optoelectronic component 30 was separated from the other optoelectronic components 30 by dividing up the molded body 300.

In the example represented, the optical lens 350 is formed as a spherical lens. The optical lens 350 may, however, also have a different shape. The optoelectronic semiconductor chip 200 may be an LED chip. In this case, the optical lens 350 may be used as a collimation lens. The optoelectronic semiconductor chip 200 may also, however, be, for example, a photovoltaic chip. In this case, the optical lens 350 may be used as concentrator optics.

If the optoelectronic semiconductor chip 200 is a photovoltaic chip, then, as represented, the optoelectronic semiconductor chip 200 may be connected by a plurality of bonding wires 260 to the electrically conductive pin embedded into the molded body to reduce the electrical resistance of the electrically conductive connection formed by the bonding wires 260.

Figure 13:
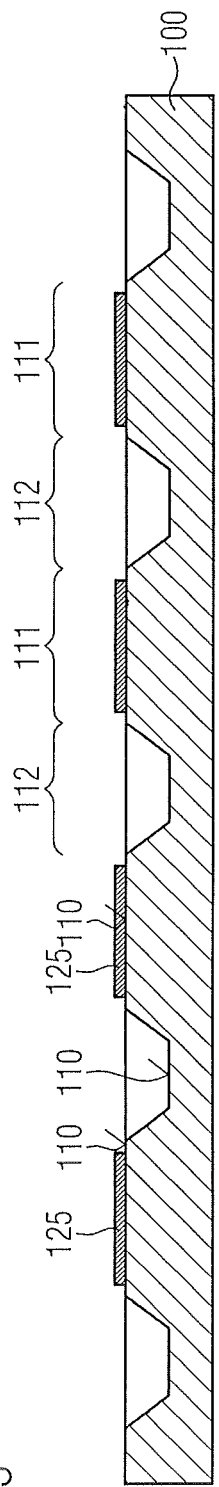
FIG. 13 shows a sectional view of a carrier having a structured adhesion layer.
Figure 14:
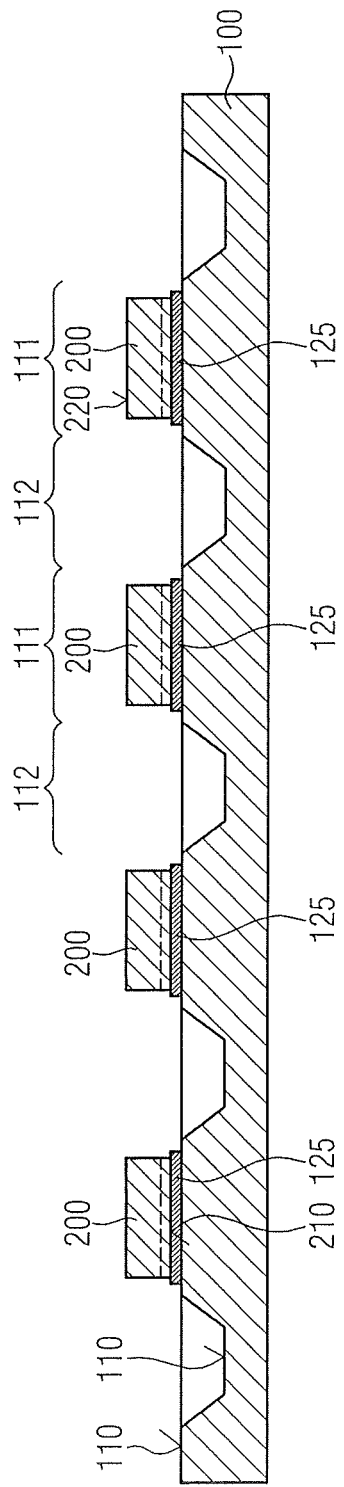
FIG. 14 shows a view of the carrier with semiconductor chips arranged on the structured adhesion layer.

FIG. 13 shows a sectional representation of the carrier 100 during the conduct of a method according to a variant of the production method explained with the aid of FIGS. 1 to 7. The method stage represented in FIG. 13 corresponds to the method stage of FIG. 2. Instead of the flat adhesion layer 120, a structured adhesion layer 125 has been arranged on the structured carrier surface 110 of the carrier 100. The structured adhesion layer 125 is in this case arranged only in those parts of the raised first lateral sections 111 of the carrier surface 110 of the carrier 100 in which optoelectronic semiconductor chips 200 are placed in the subsequent processing step shown in FIG. 14. The structured adhesion layer 125 may in other regards be configured like the adhesion layer 120, and may be arranged on the carrier surface 110 of the carrier 100 by the same method.

Compared to the flat adhesion layer 120, the structured adhesion layer 125 offers the advantage that the outer edges of the raised first lateral sections 111, i.e., the transition regions between the first lateral sections 111 and the second lateral sections 112, are not covered by the structured adhesion layer 125. The outer edges of the first lateral sections 111 can therefore be detected more simply and with high accuracy by an automatic image recognition system so that a placement accuracy of the optoelectronic semiconductor chips 200 on the carrier surface 110 can be increased. Another advantage of the structured adhesion layer 125 is that the molded body 300 formed on the carrier surface 110 also does not need to be cleaned of residues of the structured adhesion layer 125, possibly remaining on the upper side 310, in those lateral sections of the upper side 310 of the molded body 300 not in contact with the structured adhesion layer 125 during the production of the molded body 300. Another advantage of the structured adhesion layer 125 is that possible irregularities of the structured adhesion layer 125, for example, irregularities due to nonuniform deposition of the adhesion layer 125, do not lead to a height variation of the upper side 310 of the molded body 300 since the upper side 310 of the molded body 300 does not come in contact with the structured adhesion layer 125.

Figure 15:
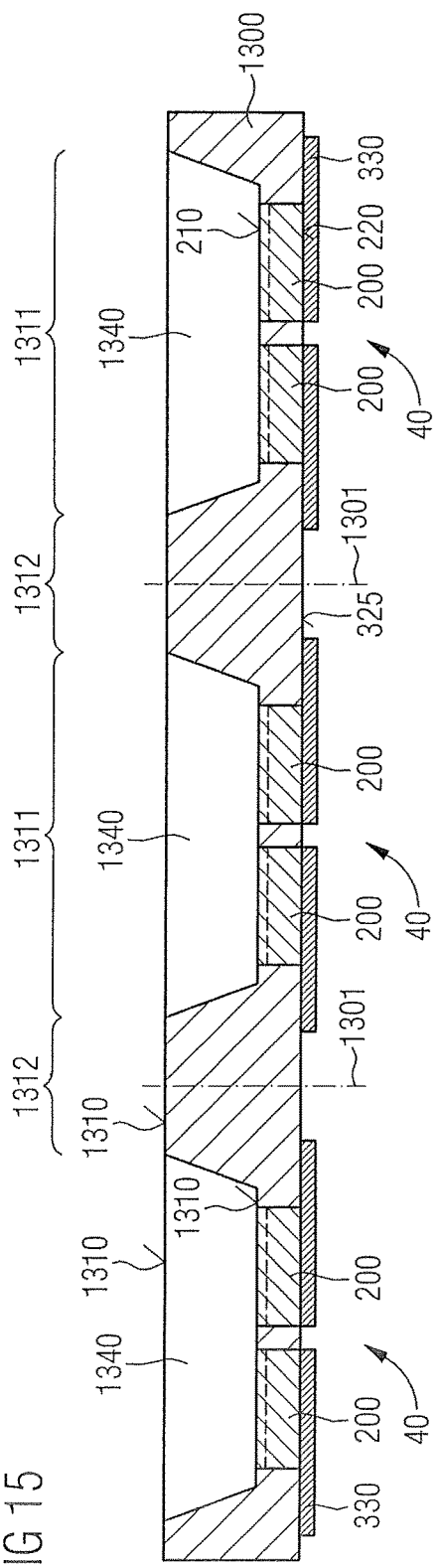
FIG. 15 shows a sectional view of a molded body having a plurality of optoelectronic components according to a fourth example.

FIG. 15 shows a schematic sectional representation of three optoelectronic components 40 according to a fourth example. The optoelectronic components 40 have correspondences with the optoelectronic components 10, 20, 30 of the example described above. Corresponding components are therefore provided with the same references and will not be described again in detail below. The optoelectronic components 40 can be produced by a method which essentially corresponds to the method explained with the aid of FIGS. 1 to 7. Differences will be explained below.

Instead of the molded body 300, the optoelectronic components 40 respectively have a molded body 1300. In the representation of FIG. 15, the molded bodies 1300 of the three optoelectronic components 40 are still connected to one another. In a subsequent processing step, the optoelectronic components 40 may be separated from one another by division at established separating regions 1301. The molded bodies 1300 may consist of the same material as the molded body 300.

An upper side 1310 of the continuous molded body 1300 has depressed first lateral sections 1311 and raised second lateral sections 1312. Each depressed first lateral section 1311 of the upper side 1310 forms a cavity 1340 of an optoelectronic component 40.

In the example represented, each optoelectronic component 40 comprises two optoelectronic semiconductor chips 200. The two optoelectronic semiconductor chips 200 of each optoelectronic component 40 are respectively arranged in the first lateral section 1311 in the bonding region of the cavity 1340. The first surfaces 210 of the optoelectronic semiconductor chips 200 are accessible on the upper side 1310 of the molded body 1300 in the first lateral section 1311 of the upper side 1310 of the molded body 1300. The second surfaces 220 of the optoelectronic semiconductor chips 200 are respectively accessible on a ground lower side 325 of the molded body 1300. It would, however, also be possible to form the optoelectronic components 40 with only respectively one optoelectronic semiconductor chip. Of course, each of the optoelectronic components 40 could also comprise more than two optoelectronic semiconductor chips 200.

A metallization 330, the individual lateral surface sections of which are respectively used to contact electrical contact surfaces arranged on the second surfaces 220 of the optoelectronic semiconductor chips 200, is in turn arranged on the ground rear side 325 of the molded body 1300.

In the first lateral sections 1311, the molded body 1300 has only a small thickness corresponding to the thickness of the optoelectronic semiconductor chips 200 between the first surface 210 and the second surface 220. A molded body 1300 with such a small thickness would, particularly before the division of the molded bodies 1300 of the multiplicity of optoelectronic components 40 at the separating regions 1301, only have a low mechanical stability associated with a risk of fracture during the processing of the optoelectronic components 40. To reduce this risk of fracture, the raised second lateral sections 1312 of the molded body 1300 lead to mechanical stabilization of the molded body 1300. Preferably, the raised second lateral sections 1312 on the upper side 1310 of the molded body 1300 form a grid before the separation of the optoelectronic components 40 so that particularly effective stabilization is achieved. Since the optoelectronic components 40 separated from one another have a substantially lower risk of fracture, the raised second lateral sections 1312 may even be removed during the separation of the optoelectronic components 40 from one another to obtain optoelectronic components 40 with particularly small dimensions. If the second lateral sections 1312 are kept, however, then the cavities 1340, formed in this way, of the optoelectronic components 40 may, as in the examples described above, be used as an optical reflector, to receive a filler material or fasten an optical lens.

Figure 16:
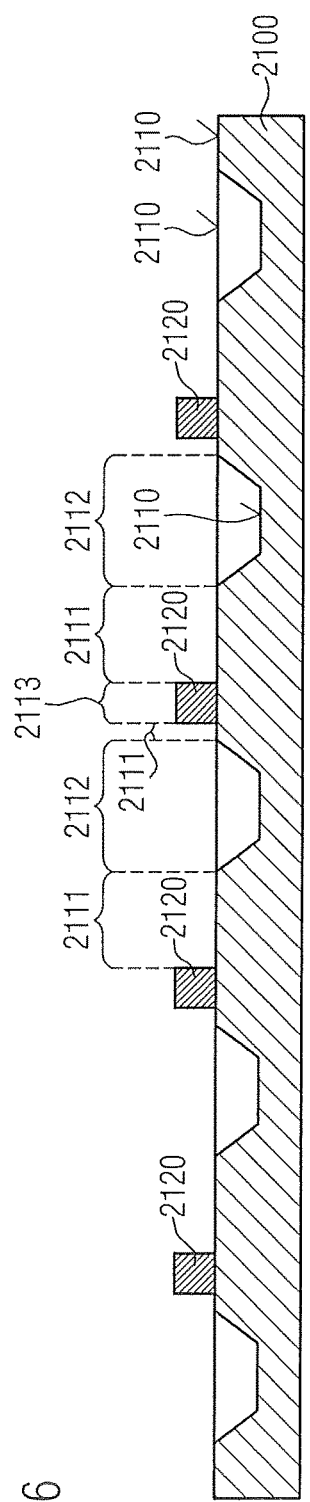
FIG. 16 shows a sectional view of a carrier according to another example.

FIG. 16 shows a sectional view of another carrier 2100. The carrier 2100 has a structured carrier surface 2110. The structured carrier surface 2110 has raised first lateral sections 2111 and depressed second lateral sections 2112. To this extent, the carrier 2100 corresponds to the carrier 100 of FIG. 1. In addition, however, arranged on the raised first lateral sections 2111 of the carrier surface 2110 of the carrier 2100 there are posts 2120 which therefore form third lateral sections 2113 of the carrier surface 2110 and are additionally raised relative to the raised first lateral sections 2111. The height of the posts 2120 relative to the first lateral sections 2111 in the direction perpendicular to the carrier surface 2110 corresponds to the thickness of the optoelectronic semiconductor chips 200 between the first surface 210 and the second surface 220.

Similar to the method explained with the aid of FIGS. 1 to 7, an adhesion layer 120 or a structured adhesion layer 125 may be arranged on the carrier surface 2110 of the carrier 2100. Subsequently, optoelectronic semiconductor chips 200 may be arranged on the carrier surface 2110 of the carrier 2100 in the first lateral sections 2111. The electrically conductive pins 250 may in this case be omitted.

Figure 17:
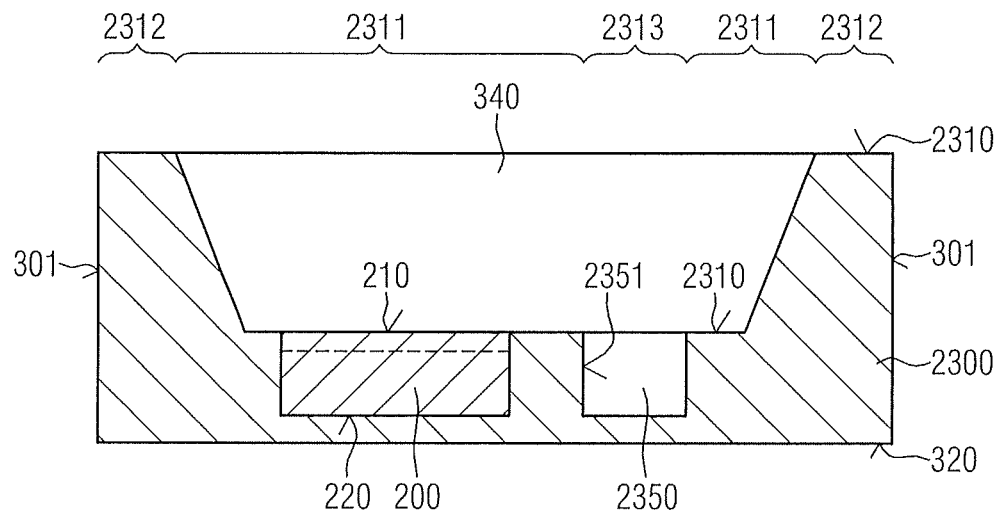
FIG. 17 shows a sectional view of a part of a molded body of another example in a first processing stage.

Lastly, a molded body 2300, into which the optoelectronic semiconductor chips 200 are embedded, is formed over the carrier surface 2110 of the carrier 2100. FIG. 17 shows a sectional representation of a part of the molded body 2300. The molded body 2300 may consist of the same material as the molded body 300. The molded body 2300 has an upper side 2310, which faced toward the carrier surface 2110 of the carrier 2100 during the production of the molded body 2300. In addition, the molded body 2300 has a lower side 320 opposite the upper side 2310. The upper side 2310 comprises first lateral sections 2311 which have been formed over the first lateral sections 2111 of the carrier surface 2110, second lateral sections 2312 which have been formed above the second lateral sections 2112 of the carrier surface 2110, and third lateral sections 2313 which have been formed above the third lateral sections 2113 of the carrier surface 2110, i.e., in the region of the posts 2120 of the carrier 2100. The first lateral section 2311 and the third lateral section 2313 together form a cavity 340 laterally bounded by second lateral sections 2312. In the first lateral section 2311 of the upper side 2310 of the molded body 2300, at the bottom of the cavity, the first surface 210 of the optoelectronic semiconductor chip 200 is accessible. The third lateral section 2313 forms an opening 2350 extending from the bottom of the cavity deeper into the molded body 2300.

In a subsequent processing step, the lower side 320 of the molded body 2300 is partially removed by grinding to obtain a ground lower side 325, on which the second surface 220 of the optoelectronic semiconductor chip 200 is accessible. Preferably, the grinding is carried out before division of the molded body 2300 on the separating regions 301.

Figure 18:
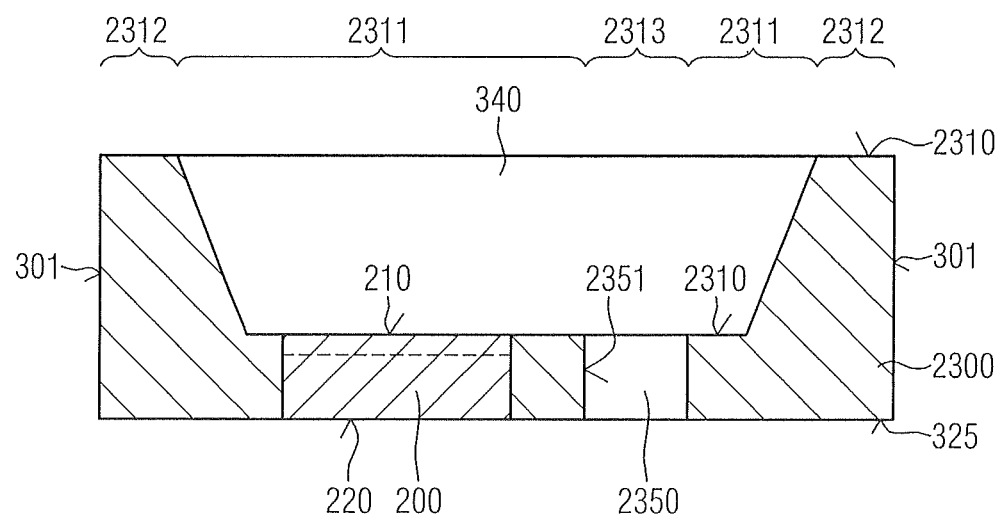
FIG. 18 shows a sectional view of the molded body in a further processing stage.

FIG. 18 shows the result of the processing step in a schematic sectional representation. On the ground lower side 325 of the molded body 2300, the second surface 220 of the optoelectronic semiconductor chip 200 is accessible. In addition, the opening 2350 is opened on the ground lower side 325 of the molded body 2300 and now forms a through-opening which extends between the ground lower side 325 of the molded body 2300 and the upper side 2310 of the molded body 2300.

Figure 19:
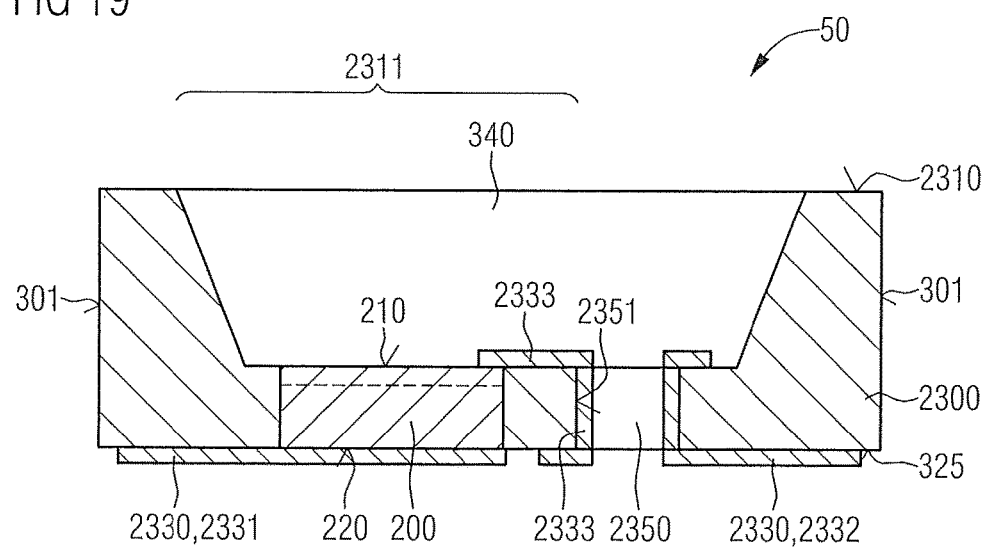
FIG. 19 shows a sectional view of an optoelectronic component produced from the molded body according to a fifth example.

In a subsequent processing step, a metallization 2330 is applied on the ground lower side 325 of the molded body 2300. Application of the metallization 2330 is preferably carried out before division of the molded body 2300. By subsequent division of the molded body 2300 along the separating regions 301, a multiplicity of optoelectronic components 50 according to a fifth example can be obtained. An optoelectronic component 50 is shown in FIG. 19 in a schematic sectional representation.

The metallization 2330 comprises a first contact surface 2331 arranged on the ground lower side 325 of the molded body 2300 and a second contact surface 2332 arranged on the ground lower side 325. The first contact surface 2331 and the second contact surface 2332 are separated from one another and therefore electrically insulated from one another. The first contact surface 2331 and the second contact surface 2332 may be used for the electrical contacting of the optoelectronic component 50 by a surface mount method.

The first contact surface 2331 is in electrically conductive connection with an electrical contact surface arranged on the second surface 220 of the optoelectronic semiconductor chip 200. The second contact surface 2332 is in electrically conductive connection with a section of the metallization 2330 extending along a wall 2351 of the opening 2350 through the opening 2350 of the molded body 2300 as far as the upper side 2310 in the first lateral section 2311 and forms a through-contact 2333. The through-contact 2333 electrically conductively connects to an electrical contact surface arranged on the first surface 210 of the optoelectronic semiconductor chip 200. The second contact surface 2332 is therefore in electrically conductive connection via the through-contact 2333 extending through the opening 2350 with the electrical contact surface 210 of the optoelectronic semiconductor chip 200.

In a simplified further example, the molded body 2300 of the optoelectronic component 50 may merely comprise the first lateral sections 2311 and the third lateral sections 2313. In this example, no cavity 340 is therefore formed on the upper side 2310 of the molded body 2300. The carrier 2100 used to produce the molded body 2300 according to this example is therefore formed as a disk on which the posts 2120 are arranged.

Our methods and components have been illustrated and described with the aid of the preferred examples. The disclosure is not, however, restricted to the examples disclosed. Rather, other variants may be derived therefrom by those skilled in the art, without departing from the protective scope of the appended claims.

The invention claimed is:

1. A method of producing an optoelectronic component comprising:
    providing a carrier having a carrier surface, a first lateral section of the carrier surface being raised relative to a second lateral section of the carrier surface;
    arranging an optoelectronic semiconductor chip having a first surface and a second surface on the carrier surface, wherein the first surface faces toward the carrier surface and the semiconductor chip is arranged on the first lateral section of the carrier surface;
    forming a molded body having an upper side facing toward the carrier surface and a lower side opposite the upper side subsequent to arranging the optoelectronic semiconductor chip on the carrier surface, wherein the semiconductor chip is at least partially embedded in the molded body and a section of the upper side of the molded body is formed flush with the first surface of the semiconductor chip, and the lower side of the molded body is formed flush with the second surface of the semiconductor chip; and
    separating the molded body from the carrier.

2. The method as claimed in claim 1, further comprising arranging an adhesion layer on at least a part of the carrier surface, wherein the semiconductor chip is arranged on the adhesion layer.

3. The method as claimed in claim 1, further comprising arranging a metallization on the lower side of the molded body.

4. The method as claimed in claim 1, wherein the second lateral section of the carrier surface annularly encloses the first lateral section.

5. The method as claimed in claim 1, wherein a raised lateral section and a depressed lateral section are formed on the upper side of the molded body, and an optical lens is arranged over the depressed lateral section of the molded body in a further step.

6. The method as claimed in claim 1, wherein the molded body is formed from an optically white material.

7. The method as claimed in claim 1, wherein the upper side of the molded body is coated at least in sections with an optically reflective material.

8. The method as claimed in claim 1, wherein a multiplicity of semiconductor chips are arranged on the carrier surface, and the molded body is divided up in a further step.

9. A method of producing an optoelectronic component comprising:
providing a carrier having a carrier surface, a first lateral section of the carrier surface being raised relative to a second lateral section of the carrier surface;
arranging an optoelectronic semiconductor chip having a first surface and a second surface on the carrier surface, wherein the first surface faces toward the carrier surface and the semiconductor chip is arranged on the first lateral section of the carrier surface;
forming a molded body having an upper side facing toward the carrier surface and a lower side opposite the upper side, wherein the semiconductor chip is at least partially embedded in the molded body and a section of the upper side of the molded body is formed flush with the first surface of the semiconductor chip; and
separating the molded body from the carrier, wherein a part of the molded body is removed after formation of the molded body.

10. A method of producing an optoelectronic component comprising:
providing a carrier having a carrier surface, a first lateral section of the carrier surface being raised relative to a second lateral section of the carrier surface;
arranging an optoelectronic semiconductor chip having a first surface and a second surface on the carrier surface, wherein the first surface faces toward the carrier surface and the semiconductor chip is arranged on the first lateral section of the carrier surface;
arranging an electrically conductive element on the carrier surface, wherein the electrically conductive element is at least partially embedded in the molded body;
forming a molded body having an upper side facing toward the carrier surface and a lower side opposite the upper side, wherein the semiconductor chip is at least partially embedded in the molded body and a section of the upper side of the molded body is formed flush with the first surface of the semiconductor chip; and
separating the molded body from the carrier.

11. The method as claimed in claim 10, wherein an electrically conductive connection is established between the semiconductor chip and the electrically conductive element.

12. The method as claimed in claim 11, wherein a bond connection is established between the semiconductor chip and the electrically conductive element.

13. A method of producing an optoelectronic component comprising:
providing a carrier having a carrier surface, a first lateral section of the carrier surface being raised relative to a second lateral section of the carrier surface;
arranging an optoelectronic semiconductor chip having a first surface and a second surface on the carrier surface, wherein the first surface faces toward the carrier surface and the semiconductor chip is arranged on the first lateral section of the carrier surface;
forming a molded body having an upper side facing toward the carrier surface and a lower side opposite the upper side, wherein the semiconductor chip is at least partially embedded in the molded body and a section of the upper side of the molded body is formed flush with the first surface of the semiconductor chip, the molded body is formed with a through-opening extending between the upper side and the lower side, and a conductive coating is arranged on a wall of the through-opening; and
separating the molded body from the carrier.

* * * * *